(12) United States Patent
Nayfeh et al.

(10) Patent No.: US 7,919,381 B2
(45) Date of Patent: Apr. 5, 2011

(54) GERMANIUM SUBSTRATE-TYPE MATERIALS AND APPROACH THEREFOR

(75) Inventors: Ammar Munir Nayfeh, Stanford, CA (US); Chi On Chui, San Mateo, CA (US); Krishna C. Saraswat, Saratoga, CA (US); Takao Yonehara, Kawasaki (JP)

(73) Assignees: Canon Kabushiki Kaisha, Tokyo (JP); The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 12/719,796

(22) Filed: Mar. 8, 2010

(65) Prior Publication Data

US 2010/0159678 A1    Jun. 24, 2010

Related U.S. Application Data

(60) Continuation of application No. 12/198,838, filed on Aug. 26, 2008, now Pat. No. 7,772,078, which is a division of application No. 11/188,140, filed on Jul. 22, 2005, now Pat. No. 7,495,313.

(60) Provisional application No. 60/590,308, filed on Jul. 22, 2004.

(51) Int. Cl.
*H01L 21/76* (2006.01)

(52) U.S. Cl. ........ 438/341; 438/413; 438/416; 438/481; 438/E21.201

(58) Field of Classification Search .......... 438/341–342, 438/413–419, 481, 607
See application file for complete search history.

(56) References Cited

U.S. PATENT DOCUMENTS

| | | |
|---|---|---|
| 5,371,037 A | 12/1994 | Yonehara |
| 5,712,199 A | 1/1998 | Nakagawa et al. |
| 5,750,000 A | 5/1998 | Yonehara et al. |
| 5,755,914 A | 5/1998 | Yonehara |
| 5,763,288 A | 6/1998 | Sakaguchi et al. |
| 5,840,616 A | 11/1998 | Sakaguchi et al. |
| 5,868,947 A | 2/1999 | Sakaguchi et al. |
| 5,970,361 A | 10/1999 | Kumomi et al. |
| 5,997,638 A | 12/1999 | Copel et al. |
| 6,106,613 A | 8/2000 | Sato et al. |
| 6,140,209 A | 10/2000 | Iwane et al. |

(Continued)

FOREIGN PATENT DOCUMENTS

JP         10-256169        9/1998

(Continued)

OTHER PUBLICATIONS

Ammar Nayfeh, et al., "Fabrication of High-Quality p-MOSFET in Ge Grown Heteroepitaxially on Si", IEEE Electron Device Letters, vol. 26, No. 5, May 2005, pp. 311-313.

(Continued)

*Primary Examiner* — Dung A. Le
(74) *Attorney, Agent, or Firm* — Fitzpatrick, Cella, Harper & Scinto (57) ABSTRACT

Germanium circuit-type structures are facilitated. In one example embodiment, a multi-step growth and anneal process is implemented to grow Germanium (Ge) containing material, such as heteroepitaxial-Germanium, on a substrate including Silicon (Si) or Silicon-containing material. In certain applications, defects are generally confined near a Silicon/Germanium interface, with defect threading to an upper surface of the Germanium containing material generally being inhibited. These approaches are applicable to a variety of devices including Germanium MOS capacitors, pMOSFETs and optoelectronic devices.

6 Claims, 6 Drawing Sheets

U.S. PATENT DOCUMENTS

| | | | |
|---|---|---|---|
| 6,143,628 | A | 11/2000 | Sato et al. |
| 6,150,031 | A | 11/2000 | Yonehara |
| 6,156,624 | A | 12/2000 | Yamagata et al. |
| 6,190,937 | B1 | 2/2001 | Nakagawa et al. |
| 6,211,038 | B1 | 4/2001 | Nakagawa et al. |
| 6,258,698 | B1 | 7/2001 | Iwasaki et al. |
| 6,306,729 | B1 | 10/2001 | Sakaguchi et al. |
| 6,331,208 | B1 | 12/2001 | Nishida et al. |
| 6,382,292 | B1 | 5/2002 | Ohmi et al. |
| 6,391,743 | B1 | 5/2002 | Iwane et al. |
| 6,429,095 | B1 | 8/2002 | Sakaguchi et al. |
| 6,452,091 | B1 | 9/2002 | Nakagawa et al. |
| 6,475,323 | B1 | 11/2002 | Ohmi et al. |
| 6,537,370 | B1 | 3/2003 | Hernandez et al. |
| 6,566,235 | B2 | 5/2003 | Nishida et al. |
| 6,613,678 | B1 | 9/2003 | Sakaguchi et al. |
| 6,639,327 | B2 | 10/2003 | Momoi et al. |
| 6,677,183 | B2 | 1/2004 | Sakaguchi et al. |
| 6,746,559 | B2 | 6/2004 | Ohmi et al. |
| 6,756,289 | B1 | 6/2004 | Nakagawa et al. |
| 6,774,015 | B1 * | 8/2004 | Cohen et al. ............ 438/479 |
| 6,787,805 | B1 | 9/2004 | Takizawa et al. |
| 6,891,578 | B2 | 5/2005 | Yonehara et al. |
| 6,972,215 | B2 | 12/2005 | Sakaguchi et al. |
| 7,015,507 | B2 | 3/2006 | Yonehara et al. |
| 7,029,950 | B2 | 4/2006 | Yonehara et al. |
| 7,341,923 | B2 | 3/2008 | Yonehara |
| 7,399,693 | B2 | 7/2008 | Sekiguchi et al. |
| 7,622,363 | B2 | 11/2009 | Yonehara et al. |
| 7,755,109 | B2 * | 7/2010 | Atwater et al. ............ 257/200 |
| 2005/0124137 | A1 | 6/2005 | Yonehara |
| 2006/0208341 | A1 * | 9/2006 | Atwater et al. ............ 257/616 |
| 2007/0224786 | A1 | 9/2007 | Brabant et al. |
| 2007/0231488 | A1 | 10/2007 | Von Kaenel |

FOREIGN PATENT DOCUMENTS

| | | |
|---|---|---|
| WO | 03-096390 | 11/2003 |

OTHER PUBLICATIONS

Ammar Nayfeh, et al., "Effects of hydrogen annealing on heteroepitaxial-Ge layers on Si: Surface roughness and electrical quality", Applied Physics Letters, vol. 85, No. 14, Oct. 4, 2004, pp. 2815-2817.

* cited by examiner

GERMANIUM SUBSTRATE-TYPE MATERIALS AND APPROACH THEREFOR

RELATED PATENT DOCUMENTS

This application is a continuation of application Ser. No. 12/198,838, filed Aug. 26, 2008, which is a divisional of application Ser. No. 11/188,140, filed Jul. 22, 2005, the contents of each of which are incorporated herein by reference. Application Ser. No. 11/188,140 claims benefit under 35 U.S.C. §119(e) to U.S. Provisional Patent Application No. 60/590,308, entitled "Germanium Substrate-type Materials and Approach Therefor," filed on Jul. 22, 2004.

FIELD OF THE INVENTION

The present invention is directed to electronic semiconductor devices and, more specifically, to electronic semiconductor devices having capacitive structures with Germanium-type substrate material.

BACKGROUND

Various types of electronic devices such as semiconductor and optoelectronic devices employ capacitive structures to effect proper circuit operation. Examples of such devices include, among others, insulated-gate field-effect transistors (IGFETs), insulated-gate thyristors, discrete capacitors and various types of optics devices. In the commonly-used IGFET, for example, a gate controls an underlying surface channel joining a source and a drain. The channel, source and drain are typically located in a semiconductor substrate material, with the source and drain being doped oppositely to the substrate material and located on either side of the channel. The gate is separated from the semiconductor substrate material by a thin insulating layer such as a gate oxide having a substantially uniform thickness. To operate the IGFET, an input voltage is applied to its gate and, through the capacitive structure defined by the electrode material on either side of the gate oxide, this input voltage causes a transverse electric field in the channel. This field then modulates the longitudinal conductance of the channel to electrically couple source and drain regions.

Various benefits can be realized by reducing the dimensions of such electronic semiconductor devices. One benefit is the ability to increase the number of individual devices that can be placed onto a single Silicon chip or die without increasing its relative size. Also, increasing the number of individual devices, especially IGFETs, leads to increased functionality. Yet another benefit is increased speed of the individual devices as well as their collective arrangements.

For decades, the semiconductor industry has been realizing these size-reduction benefits using Silicon substrates at a tremendous rate, as exemplified by the electrical performance of MOS-type (metal-oxide-semiconductor) Silicon-based IGFETs doubling every two to three years. However, the International Technology Roadmap for Semiconductors (ITRS) notes that "traditional scaling" of such Silicon-based IGFETs (e.g., planar bulk Silicon-MOS structures) is beginning to face limits to this continued progress. The extent to which the semiconductor industry can drive this scaling of Silicon-based IGFET devices is unknown, but there is agreement that the current rate of technology evolution permits only about 4 more technological-advancement nodes of this "classical" Silicon-based approach.

One promising material for use in a variety of semiconductor and optoelectronic devices is Germanium (Ge). Germanium has very high carrier mobility and generally superior transport properties, relative to other materials. For example, relative to Silicon (Si), Germanium's electron mobility is two-fold larger, and its hole mobility four-fold larger. Germanium also has a relatively small absorption coefficient, which makes it attractive for integration of monolithic photodetectors for the ultimate use in optical interconnects. In addition, successful growth of Germanium on Silicon facilitates subsequent growth of optically active material such as Gallium Arsenic (GaAs) materials since Germanium and GaAs have the same lattice constant.

In the past few decades, researchers have been trying to build MOS-type transistors and capacitors using Germanium and, in many instances, Silicon-Germanium (Site) for integrated electronic and/or optical circuit applications. However, various problems with Germanium, and in particular Germanium as implemented with Silicon, have been challenging. For example, Germanium and Silicon have different lattice structures, such that a Silicon-Germanium interface typically exhibits a lattice mismatch of about 4%. This lattice mismatch presents challenges to the epitaxial growth of Germanium on Silicon; Germanium crystallization from a Silicon-Germanium interface has typically been characterized by non-epitaxial and other defect-containing growth. Resulting Germanium crystalline structure exhibits characteristics that are often undesirable for a variety of implementations. For instance, such crystalline growth is typically associated with a large density of defects and surface roughness, causing difficulties in process integration, such as wafer bonding for Germanium-on-insulator (GOI) applications. Defects emanating from the Silicon-Germanium interface due to lattice mismatch typically propagate at the crystalline growth front to an upper surface of the Germanium material. This can lead to degradation in device properties.

The above-discussed issues have presented challenges to the fabrication and implementation of Germanium and of Silicon-Germanium interfaces with intrinsic Silicon and Germanium as well as with materials having Silicon or Germanium with other materials, such as those implemented with GOI structures (e.g., a Germanium-containing material on a Silicon Oxide type material) and others. Previous approaches involving Silicon-Germanium interfaces have generally been limited to very thin layers of Germanium (or Germanium-containing material) on Silicon (or Silicon-containing material).

SUMMARY

The present invention is directed to the above and related types of circuit devices and their manufacture, involving structures with substrate-like material susceptible to defect formation, such as Germanium. The present invention is exemplified in a number of implementations and applications, some of which are summarized below.

In connection with one example embodiment of the present invention, it has been discovered that an inert-gas type annealing process can be useful in mitigating (e.g., reducing or eliminating) issues related to the above-discussed challenges.

In connection with another example embodiment of the present invention, epitaxial Germanium is formed directly on a Silicon substrate, with an inert-gas type of annealing approach that mitigates defects associated with an interface between the epitaxial Germanium and the Silicon substrate. The Germanium is formed in at least two layers, with a first layer formed directly on the Silicon substrate and subsequently annealed in the presence of an inert gas such as Hydrogen. One or more additional layers of Germanium are then formed on the first Germanium layer.

According to another example embodiment of the present invention, a semiconductor electronics device includes a substrate, an annealed lower Germanium layer on the substrate and an upper Germanium layer on the lower Germanium layer. The lower Germanium layer has defects at an interface with the substrate and associated with a lattice mismatch between the lower Germanium layer and the substrate. The upper Germanium layer is substantially free of defects associated with said lattice mismatch, as facilitated by the annealing of the lower Germanium layer.

According to another example embodiment of the present invention, a semiconductor electronics device includes a Germanium-containing material grown on a Silicon-containing material using a hydrogen annealing approach. This approach has been discovered to mitigate surface roughness as well as misfit dislocations near a Silicon/Germanium interface in the material. An in-situ multi-step growth of Germanium with a hydrogen annealing process is implemented during Germanium growth (e.g., using a chemical vapor deposition (CVD) approach), with a first layer of Germanium grown on the Silicon-containing material and forming the Silicon/Germanium interface. Annealing of the first layer generally limits defects associated with the Silicon/Germanium interface to the first layer, with subsequently formed (and annealed) Germanium layers having relatively few defects as would otherwise be associated with the Silicon/Germanium interface. This approach facilitates the formation of a relatively thin active Germanium layer (e.g., an epitaxial Germanium layer) upon a Silicon substrate, as suitable for use in a multitude of electrical, optical and other semiconductor applications.

In another example embodiment of the present invention, a semiconductor electronics device includes a capacitive structure having a Germanium-Silicon interface characterized by growth conditions involving an inert gas annealing approach, such as discussed above. In one application, the capacitive structure includes a MOS-type device.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different approaches and arrangements involving Germanium-containing capacitive structures, and has been found to be particularly useful for semiconductor circuits employing Germanium interfaced with other substrate-type material such as Silicon. While the present invention is not necessarily limited to such circuit types, various aspects of the invention may be appreciated through a discussion of various examples using this context.

According to an example embodiment of the present invention, Germanium is grown on a substrate such as Silicon, and the grown Germanium is subjected to an in-situ annealing process. In certain applications, this annealing process is implemented to facilitate the mitigation of surface roughness and/or misfit dislocations by forming, e.g., high quality heteroepitaxial Germanium. Where misfit dislocations are mitigated, some applications involve the formation of annealed Germanium that exhibits a relatively low dislocation density, such as a density of about $1 \times 10^6$ cm$^{-2}$.

In various applications, one or more circuit arrangements use the Germanium substrate with an annealed Germanium layer as discussed above with a circuit structure formed thereon. In one example, a metal oxide semiconductor (MOS) capacitive device is formed on the annealed Germanium substrate, with an insulating (oxide) layer formed on a Germanium layer and an upper conductive material on the insulating layer. In another example, a metal-semiconductor-metal (MSM) optical device is formed on an annealed Germanium substrate. In certain MSM and/or other optical devices, additional Germanium is formed over an initial annealed Germanium layer, to achieve a thickness of the additional Germanium that mitigates or eliminates any interaction between the first annealed Germanium layer (and defects therein) and carriers generated by the device (e.g., in the additional Germanium).

In one embodiment, the Germanium is annealed after the formation of a relatively thin Germanium layer in contact with the substrate, such that the Germanium is substantially single-crystal Germanium and/or that subsequent layers of Germanium in substantially single-crystal form are facilitated. In certain applications, the relatively thin Germanium layer is formed at a thickness of about 200 nanometers, and in other applications, the Germanium layer is formed at a thickness of less than 200 nanometers.

In some applications, subsequent Germanium growth and anneal steps, similar to those discussed above, are implemented after the relatively thin Germanium layer is formed. These subsequent steps facilitate the formation of additional Germanium layers on an original Germanium layer formed directly on the substrate, with each subsequent Germanium layer being grown on an underlying annealed Germanium layer. The number of layers formed with the repeated growth and anneal approach is selected to achieve particular characteristics of the Germanium layers and/or as a function of the application to which the approach is implemented.

In one application, heteroepitaxial Germanium as discussed above is grown on Silicon using an approach that mitigates surface roughness and misfit dislocation problems associated with the (about) 4% lattice mismatch between Silicon and Germanium. A CVD process is used to grow an initial Germanium layer on the Silicon, followed by in-situ hydrogen annealing. Additional Germanium layers are formed using iterative CVD deposition and anneal steps for each layer. The thickness of each subsequent Germanium layer (as with the initial layer formed on the Silicon) is selected to facilitate the particular application for which the resulting Silicon-Germanium (SiGe) structure is to be implemented, as well as the available equipment for the CVD and anneal steps. As with the above general examples, the number of Germanium layers formed over the Silicon with the repeated growth and anneal approach is selected to achieve particular characteristics of the Germanium layers and/or as a function of the application for which the SiGe structure is implemented.

In another implementation, about a 90% reduction of surface roughness of Germanium is achieved, relative to the surface roughness prior to annealing, by hydrogen annealing one or more of the Germanium layers in a SiGe structure as discussed above, at a temperature of about 825 degrees Celsius. In some applications, this approach to reducing surface roughness is selectively implemented with a first-formed Germanium layer that is formed directly on an underlying (e.g., Silicon) substrate. In other applications, this surface roughness reduction approach is implemented with an upper surface layer of Germanium, formed over an initial layer that interfaces with an underlying substrate. In still other applications, one or more intermediate layers of Germanium material, formed over an initial layer, is processed to smooth surface roughness to facilitate the formation of subsequent Germanium (or other) layers thereon. For general information regarding Germanium-rich interfaces, reference may be made to PCT Patent Application No. PCT/US02/11785 (International Publication Number WO 03/096390 A1) entitled "High-K Dielectric For Thermodynamically-Stable Substrate-type Materials," which is fully incorporated herein by reference.

In some applications, Ge—H clusters (Germanium-Hydrogen clusters) are formed in connection with the in-situ introduction of Hydrogen to Germanium. The Ge—H clusters are used to lower the diffusion barrier associated with the Germanium to about 70 meV, taken at a temperature of about 800 degrees Celsius. The lower diffusion barrier promotes an increase in diffusivity and surface mobility in the Germanium, which facilitates a relaxation of the germanium and mitigation of defects associated with lattice mismatch.

In various implementations, a Ge—H cluster approach as discussed above is implemented to facilitate the formation of a relatively smooth Germanium surface in connection with the fabrication of MOS-type structures (e.g., capacitors, optical structures). In one particular implementation, a Tungsten/Germanium (W/Ge) oxynitride gate stack is formed using Germanium layers grown as discussed above and processed with a Ge—H cluster approach, with the gate stack exhibiting desirable capacitance-voltage (CV) characteristics with generally low hysteresis.

In another example embodiment of the present invention, a Germanium on Insulator (GOI) structure is formed using a layered Germanium growth/anneal process as discussed above. Hydrogen annealing is implemented with at least a first Germanium layer, and a second Germanium layer is formed on the first Germanium layer and exhibits substantially single-crystal, defect-free Germanium. In some applications, the Germanium structure formed with these layers is selectively bonded to a substrate such as a $Si/SiO_2$ type substrate to form a GOI structure, or to other insulative-type substrates that make up the insulative portion of the GOI structure. These approaches are useful, for example, in three-dimensional structure fabrication and others that have been implemented using other substrate-on-insulator applications such as Silicon-on-insulator (SOI) applications.

For general information regarding Germanium-type approaches, and for specific information regarding approaches to growing Germanium that may be implemented in connection the above-discussed applications and/or with other example embodiments of the present invention, reference may be made to the following references, both of which are fully incorporated herein by reference: Ammar Nayfeh, Chi On Chui, Takao Yonehara, and Krishna C, Saraswat, *Fabrication of High-Quality p-MOSFET in Ge Grown Heteroepitaxially on Si*, IEEE ELECTRON DEVICE LETTERS, VOL. 26, NO. 5, MAY 2005; and Ammar Nayfeh, Chi On Chui, Krishna C. Saraswat and Takao Yonehara, *Effects of hydrogen annealing on heteroepitaxial-Ge layers on Si: Surface roughness and electrical quality*, Applied Physics Letters, Volume 85, Number 14, Oct. 4, 2004.

Figure 1:
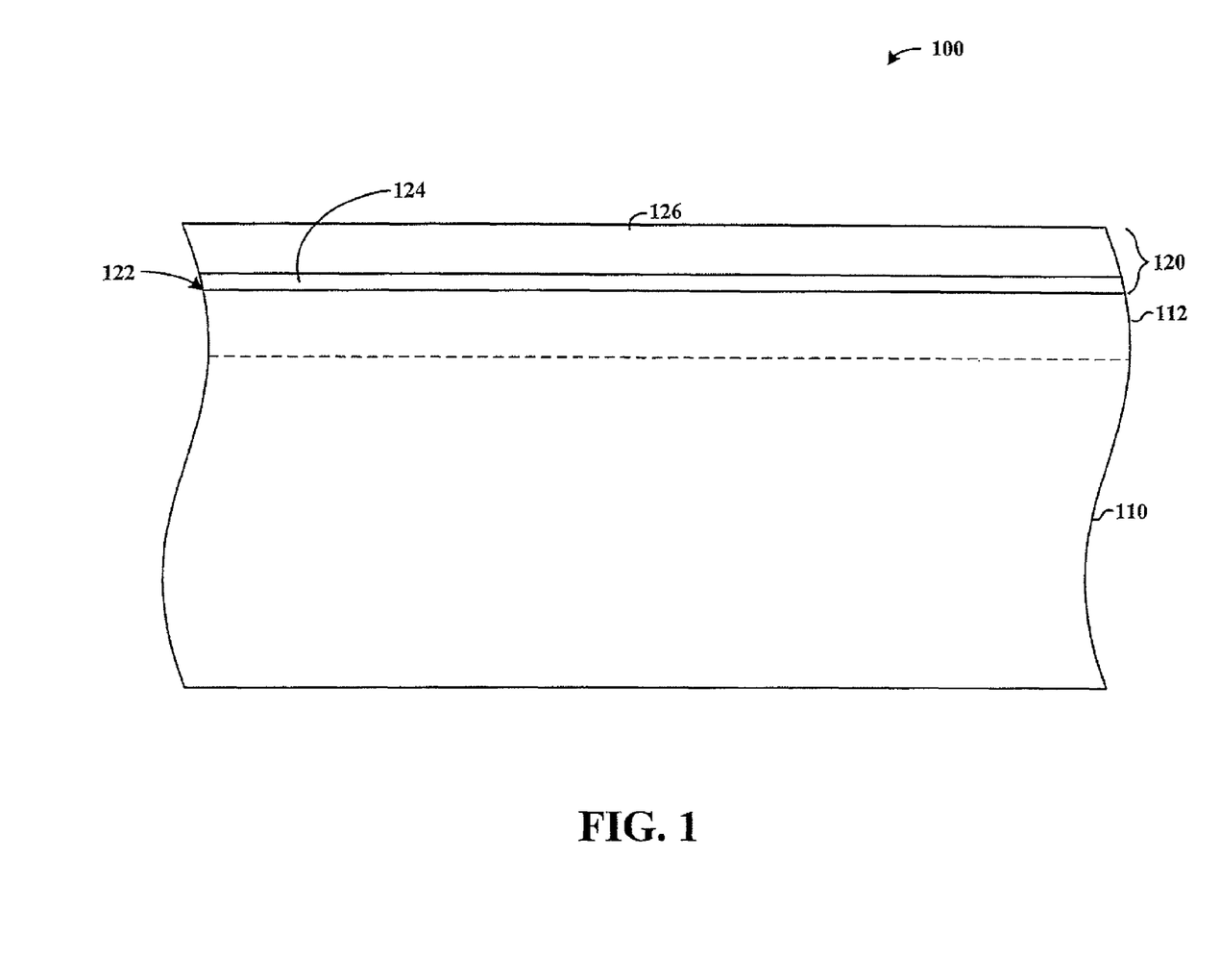
FIG. 1 shows a cross-sectional view of a Germanium-based device with an annealed Germanium layer, according to an example embodiment of the present invention.

FIG. 1 shows a Germanium-based device 100 with an annealed Germanium layer, according to another example embodiment of the present invention. The device 100 includes a substrate 110 having a semiconductor material such as Silicon, with a Germanium-containing material 120 over the substrate. In the Germanium-containing material 120 and near an interface 122 between the Germanium-containing material and the substrate 110 is a first annealed Germanium-containing layer 124. The annealed characteristics of the Germanium-containing layer 124 facilitate the subsequent growth of an upper Germanium-containing layer 126 that is substantially epitaxial Germanium, and substantially free of defects associated with the growth of Germanium near an interface such as interface 122. In some instances, the annealed characteristics of the Germanium-containing layer 124 result in a surface at a Germanium-layer interface 122 having a roughness that is at least 50% reduced and, in some instances, at least 80% reduced, relative to a surface of such a Germanium-containing layer without the aforesaid annealing.

In one implementation, the Germanium-based device 100 includes an insulating-type material in an upper portion 112 of the substrate 110. The insulating material has a composition including a material such as a Silicon Oxide that is suitable for insulating an active semiconductor layer. In this regard, the Germanium-containing material 120 forms, with the insulating-type material in the upper portion 112, a Germanium-on-insulator structure. In this regard, the Germanium-containing material 120 is suitable for use with circuits as an active layer, such as for MOS-type devices with electrodes and/or other circuitry formed on the Germanium-containing material.

Figure 2A:
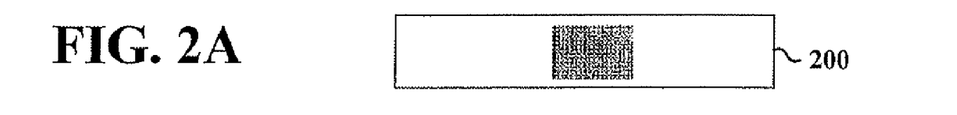
FIGS. 2A-2C show a cross-sectional view of a Germanium-based semiconductor device at various stages of manufacture, according to another example embodiment of the present invention.
Figure 2B:
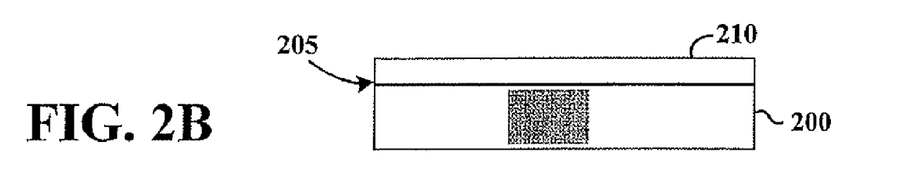
Figure 2C:
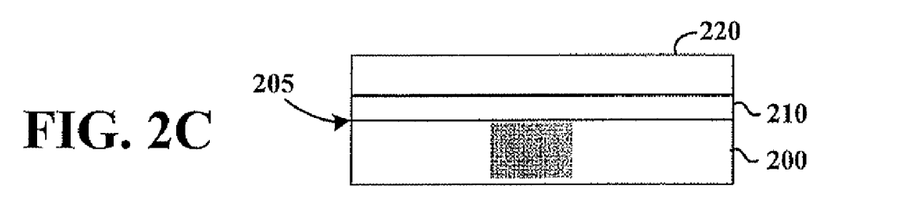
Figure 2D:
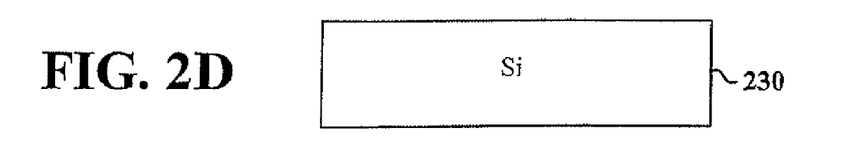
FIGS. 2D-2G show a cross-sectional view of a Germanium-based circuit device at various stages of manufacture, according to another example embodiment of the present invention.

FIGS. 2A-2C show a cross-sectional view of a Germanium-based semiconductor device at various stages of manufacture, according to another example embodiment of the present invention. Beginning with FIG. 2A, a Silicon wafer 200 is provided and/or manufactured, having a Silicon-based composition such as Silicon or Silicon with another material such as oxide (e.g., as with FIG. 1, having an upper insulated portion for implementation with GOI applications).

In FIG. 2B, a thin Germanium layer 210 is grown on the Silicon wafer 200 to a thickness of about 200 nm using a CVD approach, such as by introducing a Germanium-containing gas such as Germane (GeH$_4$) under conditions amenable to the deposition and growth of Germanium (e.g., a temperature of about 430 degrees Celsius). In some applications, the Germanium deposition is carried out to facilitate the formation of intrinsic Germanium, and in other applications a dopant is added. The Germanium layer 210 is subjected to a Hydrogen annealing process, with the introduction of Hydrogen at an elevated temperature (e.g., at least about 500 degrees Celsius and, in some instances, about 825 degrees Celsius). The ambient pressure involved in the annealing is selected for the particular application, and in some instances, is about 80 Torr. Defects that generally propagate from a Silicon-Germanium interface 205 between the Germanium layer 210 and the substrate 200 are generally confined to the Germanium layer 210, with the annealing facilitating characteristics in the Germanium, as well as with an upper surface thereof (i.e., smoothness), that are amenable to such defect confinement.

Hydrogen is introduced to the Germanium layer 210 in FIG. 2B during annealing using one or more of a variety of approaches. One example approach involves using a CVD chamber having a gas-type material feed. The CVD chamber may be implemented using a CVD chamber similar to that used for growing epitaxial Silicon for semiconductor devices, such as wherein epitaxial Silicon is grown on a bulk Silicon substrate (here, akin to the Silicon wafer 200). The Silicon wafer 200 is placed in such a CVD chamber and a vacuum is drawn on the chamber (e.g., to about 10 Torr). While the vacuum is drawn, a Germanium-containing gas is introduced to the Silicon wafer 200 and the Germanium layer 210 is grown from the interface 205. After the Germanium layer 210 is grown, the CVD chamber is brought to conditions of a temperature of about 825 degrees Celsius and a pressure of about 80 Torr for annealing while Hydrogen gas is introduced to the chamber. In some applications, Germanium-containing gas in the CVD chamber is substantially evacuated, prior to introduction of the Hydrogen.

After the Germanium layer 210 is annealed, a second Germanium layer 220 is grown using CVD as shown in FIG. 2C and having a thickness that is substantially thicker than that of the Germanium layer 210. In some applications, the Germanium layer 200 is grown to a thickness of about 400 nm; in other applications the Germanium layer is grown to a thickness of about 800 nm; and in still other applications, the Germanium layer is grown to a thickness of about 1 µm or more. In applications where the arrangement in FIG. 2C is implemented with optics, such as for MSM photodetectors, the second Germanium layer 220 is formed to a thickness of about 4 µm or more with Germanium therein being intrinsic. This second Germanium layer 220 is optionally annealed in a manner similar to that described above in connection with the first Germanium layer 210. Defects characterizing the growth of Germanium at a Silicon-Germanium interface (i.e., interface 205) are substantially limited to the first Germanium layer 210 as discussed above, with the second Germanium layer 220 being substantially epitaxial, defect-free Germanium.

In one implementation, the first Germanium layer 210 is grown using a Hydrogen anneal process in which Hydrogen atoms are attached Germanium atoms to reduce the diffusion bather for Germanium, thus increasing Germanium surface mobility. After the first growth, the second Germanium layer 220 is grown using similar growth conditions to that with the first Germanium layer 210, selectively followed by another Hydrogen anneal process at respective temperature and pressure of about 700 degrees Celsius and about 80 Torr. Defects in the first Germanium layer 210 are generally confined near the Silicon-Germanium interface 205, in some instances bending laterally (and thus inhibited from reaching an upper portion of the first Germanium layer). Upper portions of the first Germanium layer 210, away from the Silicon-Germanium interface 205, as well as the second Germanium layer 220, exhibit substantially defect-free, fully-relaxed and smooth single-crystal Germanium.

FIGS. 2D-2G show a cross-sectional view of a Germanium-based circuit device at various stages of manufacture, according to another example embodiment of the present invention. Beginning with FIG. 2I), a Silicon substrate 230 is provided and/or fabricated, including Silicon and, in some instances, other materials such as those implemented with bulk substrates for semiconductor wafers.

Figure 2E:
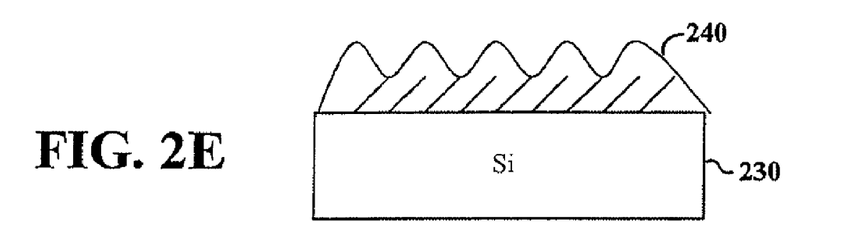

In FIG. 2E, a Germanium-containing material 240 has been formed on the Silicon substrate 230, using a CVD type process as discussed above, or another suitable process for depositing the Germanium. Due to conditions including the lattice mismatch between Germanium and Silicon in the Silicon substrate 230, the Germanium-containing material 240 exhibits islanding-type characteristics and dislocations relating to misfit and threading conditions along inclined slip planes shown in the Germanium-containing material.

Figure 2F:
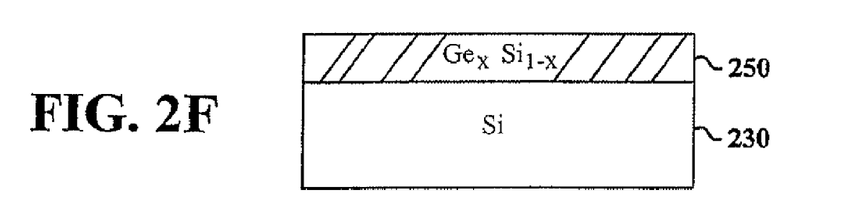

In FIG. 2F, the Germanium-containing material 240 in FIG. 2E has been annealed in Hydrogen using an approach as discussed above to form an annealed Germanium-containing layer 250. The annealing approach is implemented to facilitate the gliding of threading dislocations along the inclined slip planes as driven by misfit and thermal expansion coefficient mismatch between the Germanium and Silicon. The Germanium-containing layer 250 includes Silicon, diffused from the Silicon substrate 230 and in a form that can be characterized by $Ge_x Si_{1-x}$ where "x" is an appropriate integer. The gliding of the threading dislocations and the diffusion of the Silicon is selectively implemented and controlled with the annealing process to facilitate the relief of misfit strain conditions in the Germanium-containing material 240, effectively relaxing the Germanium-containing material. The hydrogen (or hydrogen-containing gas) implemented during the anneal is selected to mitigate or eliminate the formation of surface oxide on an upper surface of the Germanium-containing layer 250.

Figure 2G:
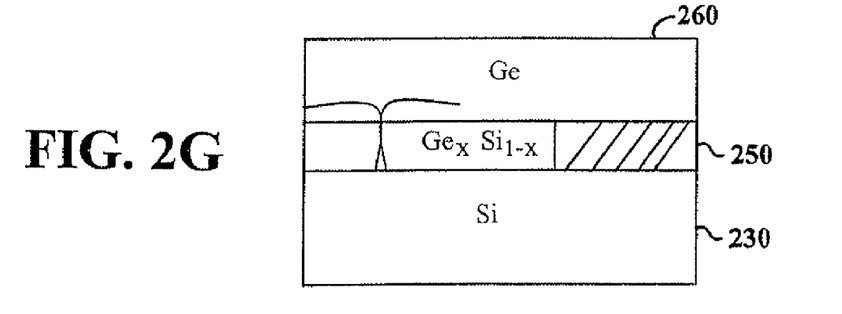

In FIG. 2G, Germanium material 260 is formed on the upper surface of the Germanium-containing layer 250 and annealed to facilitate the formation of substantially single-crystalline Germanium. Defects are generally limited to the Germanium-containing layer 250, near an interface with the Silicon substrate 230 and with minimal (if any) defects in the Germanium material 260 and/or defects therein limited to a lower portion near the Germanium-containing layer 250. In some implementations, the Germanium material 260 is formed by subsequently depositing layers of Germanium, with a first such layer deposited on the Germanium-containing layer 250 and one or more additional layers formed over the first such layer. Where multiple layers of Germanium are deposited to form the Germanium material 260, each layer is selectively subjected to an anneal, prior to deposition of an additional Germanium layer, to facilitate a smooth interface between the layers and/or other characteristics of the Germanium material.

The resulting Silicon-Germanium (Si—Ge) structure in FIG. 2G is adapted for selective implementation with one or more of a variety of electronic, optical and other devices. In one example, the Germanium material 260 is coupled to circuitry (e.g., an interconnect or contact) and used as an active semiconductor region. The deposition and annealing approach used in forming the Germanium-containing layer 250 facilitates the confinement of some or all defects resulting from conditions at an interface between Germanium and the Silicon substrate 230. In this regard, the Germanium material 260 is substantially defect-free (e.g., having a dislocation density of less than about $1.5 \times 10^6$ cm$^{-2}$) and amenable to use in such an active region of circuits or optical devices.

In some applications, the Germanium material 260 is doped or otherwise processed in-situ, to suit applications in which the structure in FIG. 2G is used. For example, where the Si—Ge structure is implemented with a p-n-p or an n-p-n type of structure, the Germanium material 260 is selectively doped n or p, with subsequent (post-formation) doping steps carried out to complete n and/or p type portions of the structure. Other example structures and applications suitable for in-situ processing approaches may be implemented in connection with additional examples and/or figures as discussed further below.

Figure 3:
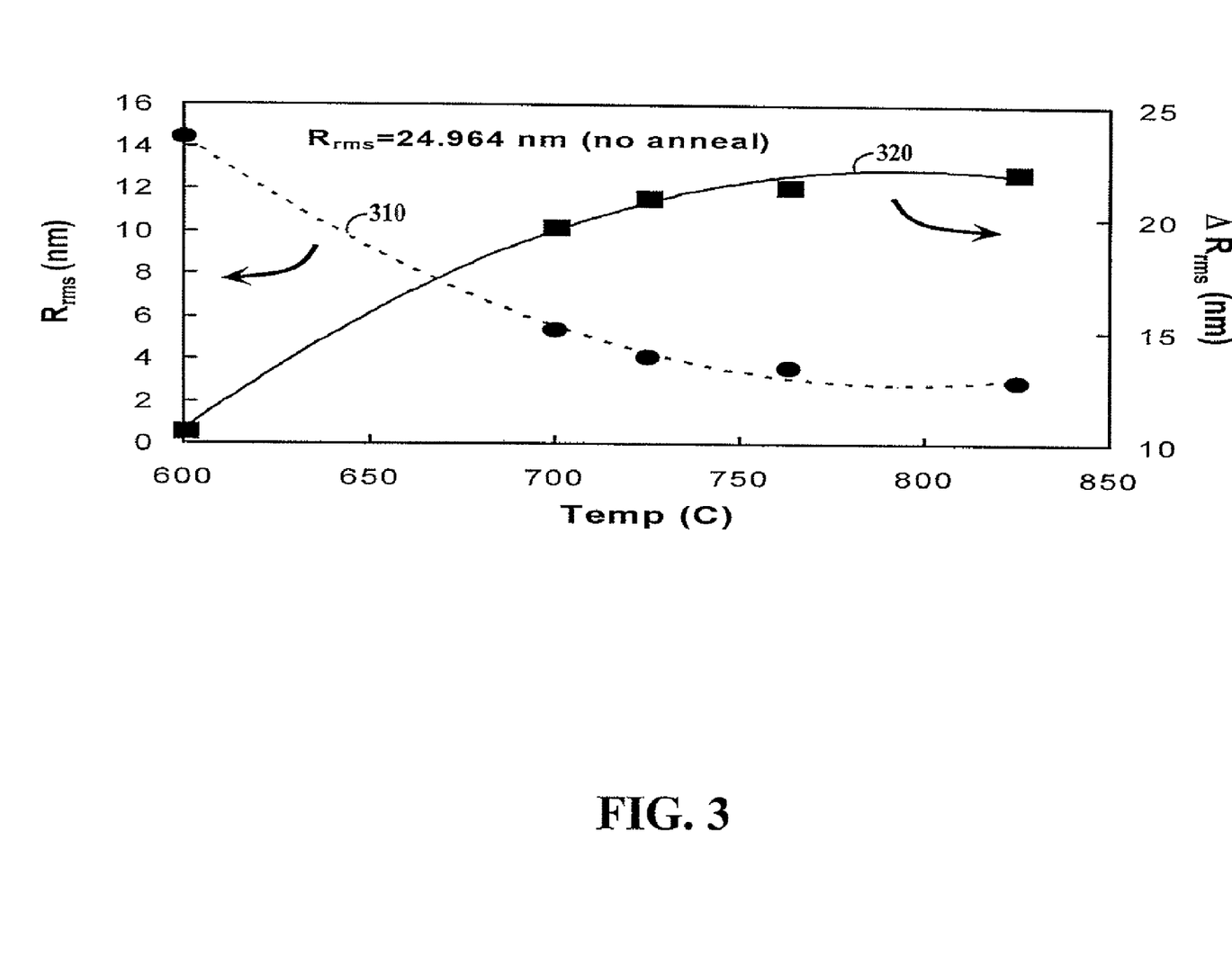
FIG. 3 shows plots depicting RMS roughness ($R_{rms}$) characteristics versus anneal temperature, in connection with various example embodiments.

FIG. 3 shows a plot 310 depicting example absolute value of RMS roughness ($R_{rms}$) (left vertical axis) as well as a plot 320 showing example change in $R_{rms}$ (right vertical axis), both as a function of Hydrogen ($H_2$) anneal temperature (horizontal axis) with Germanium for five different anneal temperatures, in connection with various example embodiments. One or more of the various shown $H_2$ anneal temperatures and temperature ranges are selectively implemented with anneal approaches as described above, in the formation of Germanium-containing material for use with circuits, optics and other devices. For example, one annealing approach involves the use of Hydrogen at about 825 degrees Celsius, facilitating a reduction in surface roughness ($R_{rms}$) of about 88%, relative to R without an anneal process (e.g., with $R_{rms}$ of about 25 nm).

Figure 4:
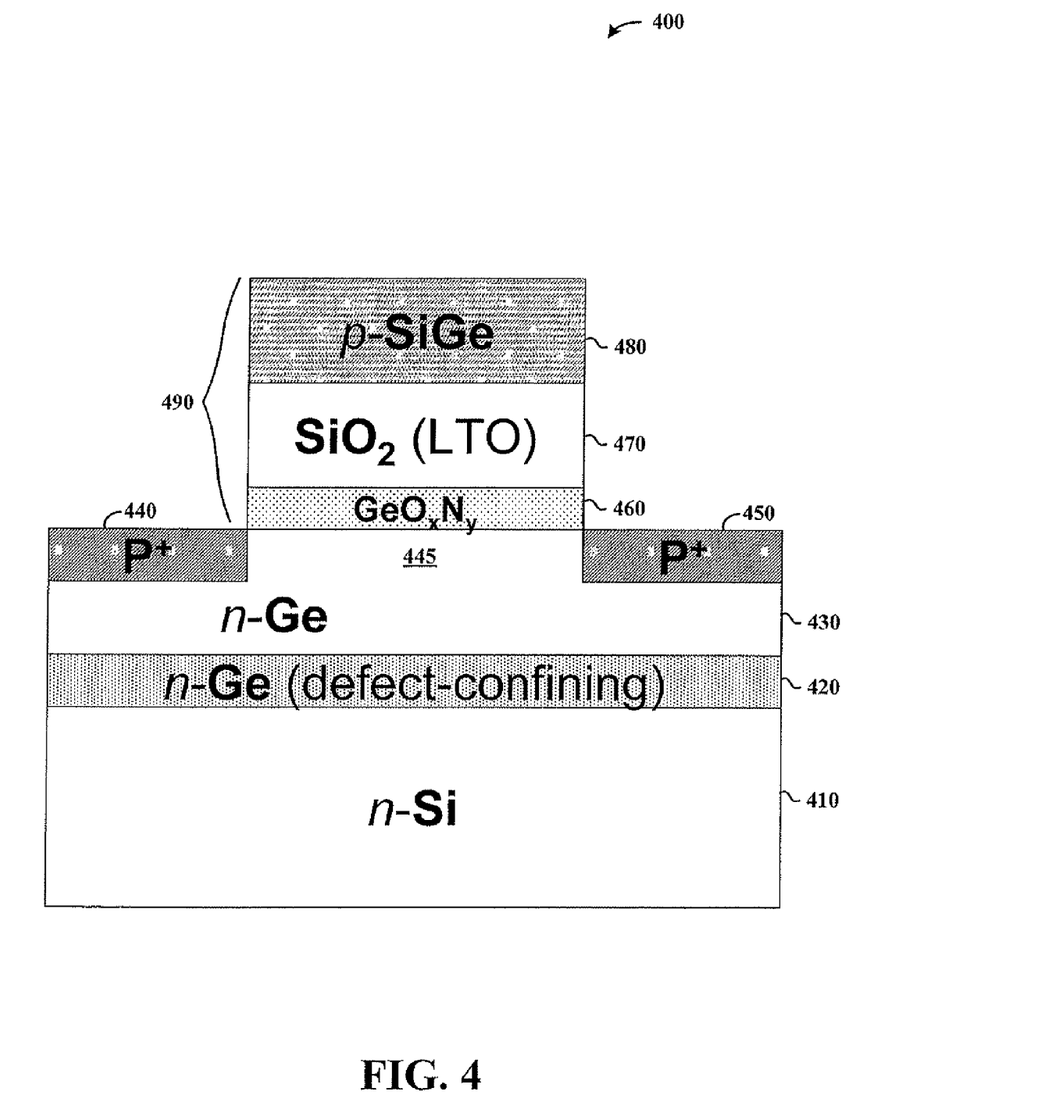
FIG. 4 shows a p-MOS type Germanium-based device, according to another example embodiment of the present invention.

FIG. 4 shows a p-MOS type Germanium-based device 400, according to another example embodiment of the present invention. The device 400 includes an n-doped Silicon (n-Si) layer 410, on which epitaxial Germanium-containing material is formed. The epitaxial Germanium-containing material includes a defect-confining n-Germanium (n-Ge) layer 420 formed on the n-Si substrate 410 using, for example, CVD with a subsequent anneal in Hydrogen. The formation of the n-Ge layer 420 may, for example, involve an approach similar to that discussed above in connection with one or more of the figures. The resulting (post-anneal) n-Ge layer 420 exhibits characteristics that facilitate the general confinement of a substantial amount of defects in the n-Ge layer to a region near an interface with the Silicon substrate 410.

An active n-Ge layer 430 is arranged on the n-Ge layer 420, with two P+ doped source/drain type regions 440 and 450 formed near an upper surface thereof. Some or all of the n-Si substrate 410, n-Ge layer 420 and n-Ge layer 430 are doped with an n-type dopant using an in-situ doping approach as discussed above.

A gate stack 490 is formed over the active n-Ge layer 430, with a region 445 of the n-Ge layer 430 forming a channel between the source/drain type regions 440 and 450. The gate stack 490 includes a GeO$_x$N$_y$ dielectric layer 460, a SiO$_2$ layer 470 and a p-SiGe electrode 480, formed using one or more of a variety of approaches. In one implementation, the GeO$_x$N$_y$ layer 460 is grown using an NH$_3$ approach, (e.g., with a rapid thermal processing approach in the presence of NH$_3$), the SiO$_2$ layer 470 is formed using a low temperature oxide (LTO) deposition approach, and the SiGe electrode 480 is formed via in-situ boron doping during CVD (e.g., at about 500 degrees Celsius).

After the gate stack 490 is formed, the source/drain type regions 440 and 450 are doped with a p-type material (as discussed above) using the gate stack as a mask; in some applications, a masking material is implemented on the electrode 480 during the doping process. After the source/drain type regions 440 and 450 are doped, a 450 degrees Celsius rapid thermal annealing (RTA) is used to activate the dopant. Contacts can subsequently be defined on one or more of the source/drain type regions 440 and 450 using, e.g., a LTO deposition with Aluminum approach on the doped regions, followed by a 400 degrees Celsius forming gas anneal (FGA).

Figure 5:
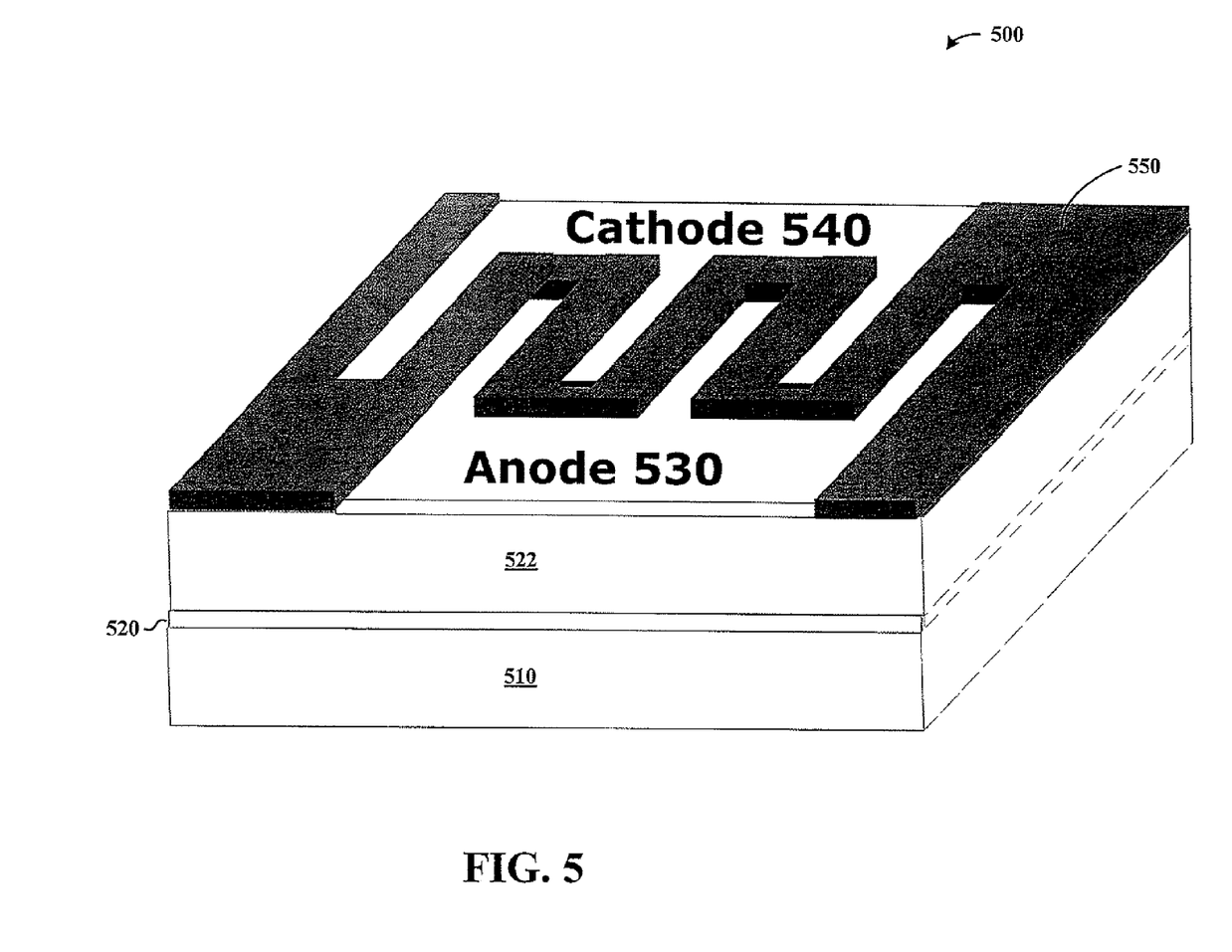
FIG. 5 shows a cross-sectional view of an MSM-PD arrangement, according to another example embodiment of the present invention.

FIG. 5 shows a cross-sectional view of an MSM-PD arrangement 500, according to another example embodiment of the present invention. The arrangement 500 includes a Silicon substrate layer 510 and epitaxial Germanium layers 520 and 522. The epitaxial Germanium layers 520 and 522 are formed on the Silicon substrate layer 510 using a multiple annealing approach, with a resulting thickness of about 4.5 µm. The thin Germanium layer 520 is formed directly on the Silicon substrate layer 510 and annealed to mitigate the propagation of defects in the subsequently-formed Germanium layer 522, such that the Germanium layer 522 is substantially defect-free.

Using the Germanium layer 522 as an active region, an MSM-PD is formed with an anode 530 and cathode 540 on the Germanium layer 522 and separated by an insulative layer 550, which includes an insulative material such as SiO$_2$. In one implementation, one or both of the anode 530 and cathode 540 are formed by first depositing a 3000 Å thick low temperature chemical vapor deposition (LTO) oxide layer is deposited at 400° C. followed by metal electrode e-beam evaporation and photoresist liftoff. About 150 Å of Ti, Cr, or Ni are used for work function control and adhesion, topped with about 350 Å of Au to facilitate high-speed measurements.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, for example: forming Germanium on a variety of substrates, mitigating Germanium-substrate interface issues with substrates other than Silicon that exhibit a lattice mismatch with Germanium, and using the approaches discussed above with other materials substituted for and/or used in connection with Germanium. Furthermore, various ones of the example embodiments, implementations and approaches discussed may be implemented for a variety of applications. For example, advanced gate dielectrics involving high-κ (high dielectric constant) are selectively implemented with the grown Germanium layers. Germanium Oxynitride technology is selectively implemented for CVD of Germanium as discussed herein. CVD-based Germanium layer growth processes are selectively followed with GaAs growth on the Germanium layer(s) for the integration of Germanium, Silicon and GaAs. Devices that can be built with the Germanium layer/anneal approach include Germanium-based MOS type devices such as capacitors, Schottky/PN diodes, Germanium-based photodetectors, metal-semiconductor-metal (MSM) devices for optical circuits including interconnects, MSM photodetectors (MSM-PDs), and Germanium/Silicon quantum well devices for photonic, spintronic and other applications. Moreover, the example embodiments, implementations and approaches discussed herein may be used in connection with one another, with various combinations and related approaches implemented to fit various applications. In addition, other annealing approaches, such as those involving inert gasses other than Hydrogen, may also be implemented.

EXPERIMENTAL APPROACHES

Aspects of the following experiments are selectively carried out in connection with one or more of the example embodiments, implementations and applications of the present invention.

Approach 1:

An epitaxial Germanium layer having a thickness of about 200 nm is grown at 400° C. with reduced pressure of about 10 Torr. Five different hydrogen anneals are carried out for about one hour immediately following the epitaxial growth, at respective temperatures of about 600° C., 700° C., 725° C., 763° C. and 825° C. and at a pressure of about 80 Torr. Surface roughness can be evaluated by using a 10 µm×10 µm atomic force microscope (AFM) scan.

Approach 2:

About 200 nm of epitaxial Germanium layers are grown via CVD on bulk Silicon wafers with resistivity of about 1-5 Ω-cm. The wafers are dipped in 50:1 HF (Hydrofluoric acid) for about 30 seconds and loaded in an epitaxial reactor. The wafers are baked in hydrogen at 950° C. to insure no native oxide remained on the surface. Epitaxial Germanium is grown at about 400° C. at reduced pressure of about 10 Torr. Five different hydrogen anneals are carried out for about 1 hour following the epitaxial growth at temperatures of 600° C., 700° C., 725° C., 763° C. and 825° C. at a pressure of 80 Torr, and one wafer is left un-annealed for comparison. A 10 µm×10 µm AFM scan and a cross section High Resolution Scanning Electron Microscopy (HR-SEM) are used to observe surface roughness.

Approach 3:

A Germanium layer is formed on a Silicon substrate and annealed in Hydrogen. An epitaxial Germanium (epi-Ge) layer is formed on the annealed Germanium layer and is in-situ doped n-type during deposition followed by cyclic rinsing between 50:1 HF solution and DI water. The epi-Ge layer is annealed at about 825° C. $GeO_xN_y$ is grown directly on the 825° C. annealed epi-Ge substrate in a rapid thermal processing (RTP) system using ammonia ($NH_3$) and 500 Å of tungsten (W) electrode is deposited by room temperature electron-beam (e-beam) evaporation through a shadow mask.

What is claimed is:

1. A method for growing Germanium, the method comprising:

growing a first Germanium layer on a Silicon-containing substrate;

annealing the first Germanium layer in the presence of Hydrogen to reduce a roughness of an interface between the Silicon-containing substrate and the first Germanium layer at least 50%;

growing a second Germanium layer on the first annealed Germanium layer; and annealing the second Germanium layer in the presence of Hydrogen to cause the second Germanium layer to have a dislocation density of less than $1.5 \times 10^6$ $cm^{-2}$.

2. A method for manufacturing a semiconductor substrate, the method comprising:

forming a first layer comprising Germanium on a substrate;

annealing the first layer in an atmosphere comprising hydrogen to reduce a roughness of an interface between the Silicon-containing substrate and the first layer at least 50%;

forming a second layer comprising Germanium on the first layer; and annealing the second layer in the presence of Hydrogen to cause the second layer to have a dislocation density of less than $1.5 \times 10^6$ $cm^{-2}$.

3. The method according to claim 2, wherein the substrate is a silicon substrate.

4. The method according to claim 2, wherein the first layer is a Germanium layer.

5. The method according to claim 2, wherein the second layer is a Germanium layer.

6. The method according to claim 2, further comprising forming a semiconductor device on the second layer.

* * * * *